(12) United States Patent
Mehrotra

(10) Patent No.: US 8,691,661 B2
(45) Date of Patent: Apr. 8, 2014

(54) TRENCH WITH REDUCED SILICON LOSS

(75) Inventor: Manoj Mehrotra, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 123 days.

(21) Appl. No.: 13/284,241

(22) Filed: Oct. 28, 2011

(65) Prior Publication Data

US 2012/0104540 A1 May 3, 2012

Related U.S. Application Data

(60) Provisional application No. 61/407,756, filed on Oct. 28, 2010.

(51) Int. Cl.
*H01L 21/76* (2006.01)

(52) U.S. Cl.
USPC .................................. 438/427; 257/E21.548

(58) Field of Classification Search
USPC ................... 438/430, 445, 446; 257/E21.548
See application file for complete search history.

(56) References Cited

U.S. PATENT DOCUMENTS

| 5,895,253 | A   | * | 4/1999  | Akram       | 438/427 |
|-----------|-----|---|---------|-------------|---------|
| 6,207,532 | B1  | * | 3/2001  | Lin et al.  | 438/430 |
| 7,354,812 | B2  | * | 4/2008  | Batra et al.| 438/196 |
| 2007/0218645 | A1 | * | 9/2007  | Zhou        | 438/427 |
| 2007/0238251 | A1 | * | 10/2007 | Liau et al. | 438/270 |
| 2007/0254453 | A1 | * | 11/2007 | Ang         | 438/425 |

* cited by examiner

*Primary Examiner* — Chandra Chaudhari
(74) *Attorney, Agent, or Firm* — Wade J. Brady, III; Frederick J. Telecky, Jr.

(57) ABSTRACT

An isolation trench in a substrate of a semiconductor device includes a first shallow portion, a transition region, and a second deeper portion. The isolation trench contains a dielectric filler. The isolation trench is formed by first forming a first shallow portion of the isolation trench, forming polysilicon sidewalls on the first shallow portion, and then etching the second deeper portion.

13 Claims, 8 Drawing Sheets

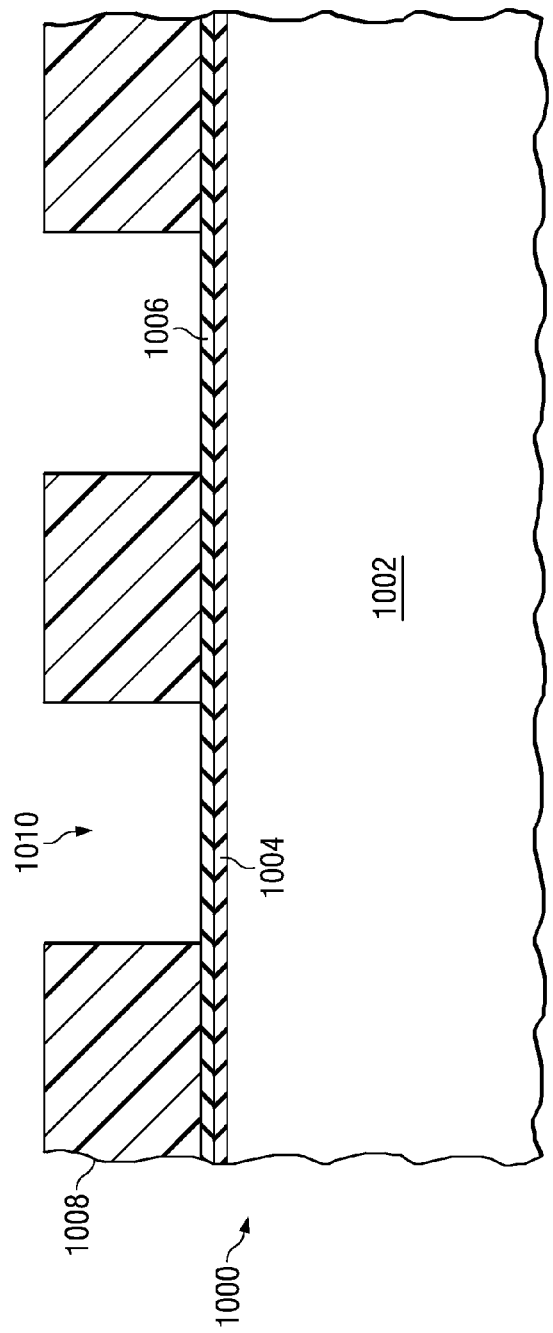
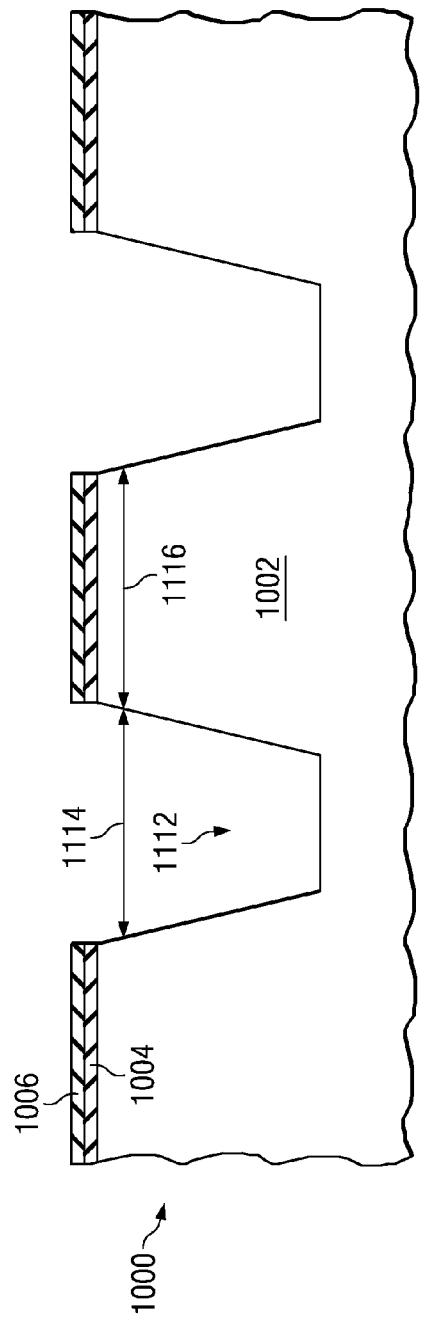

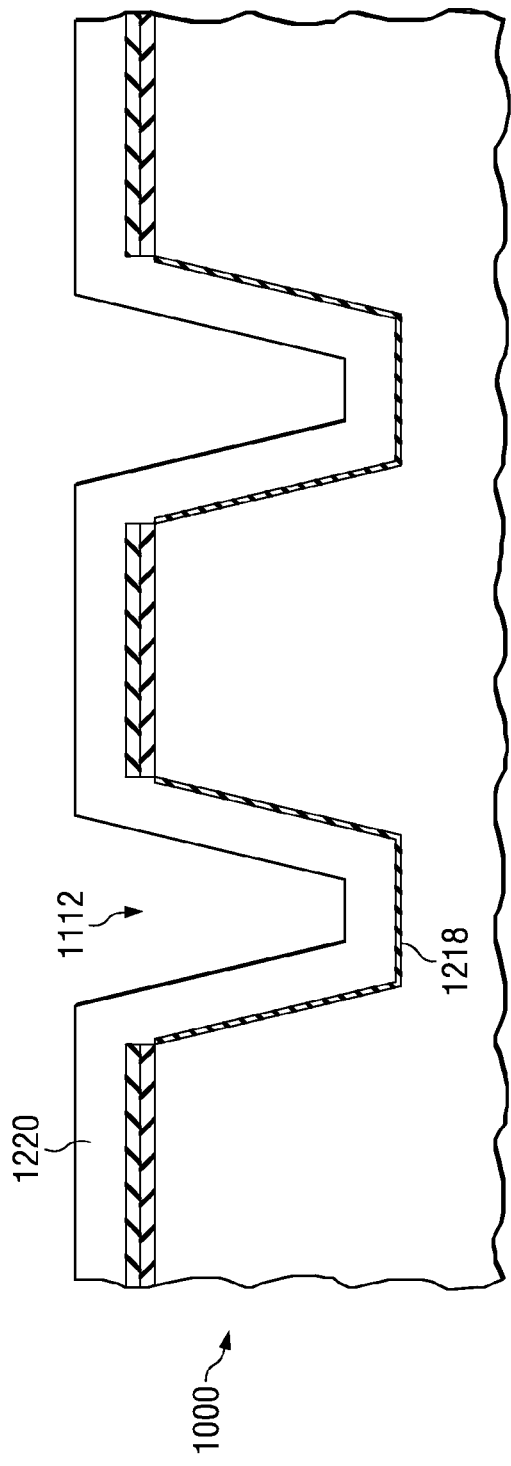
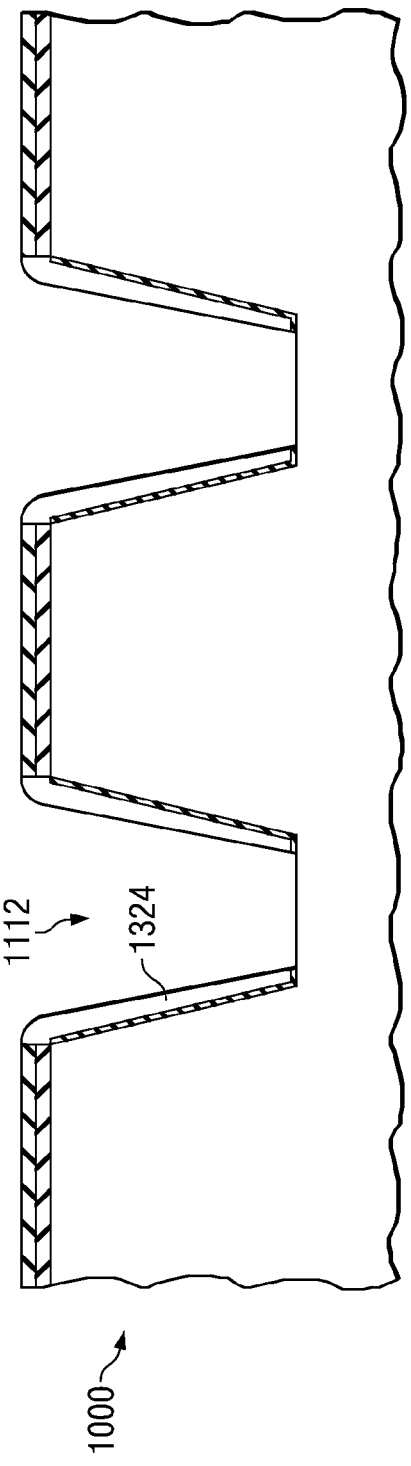

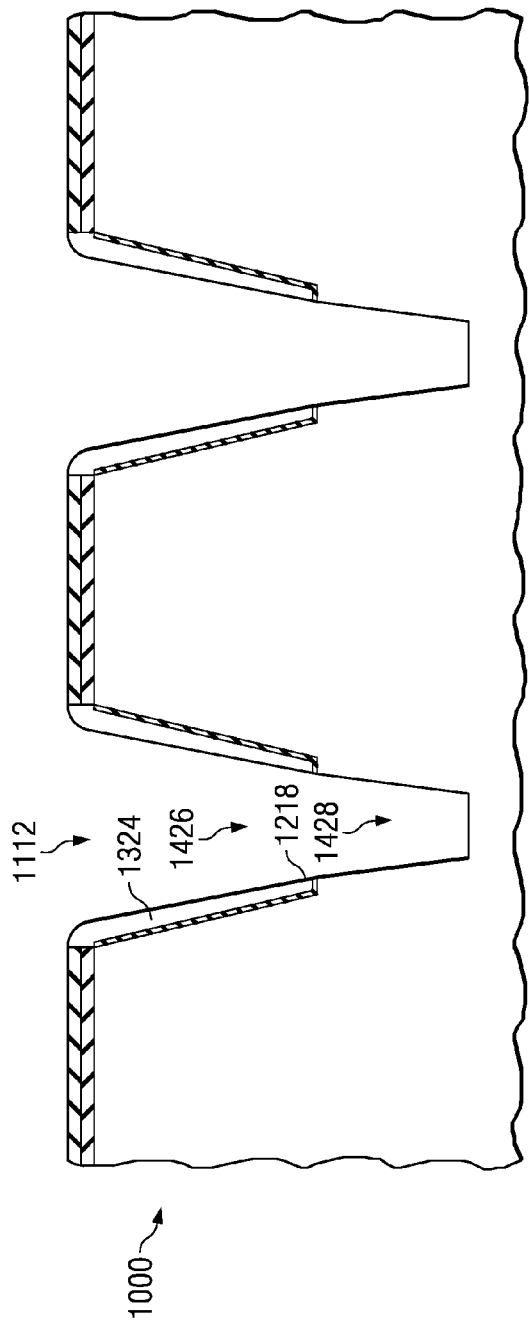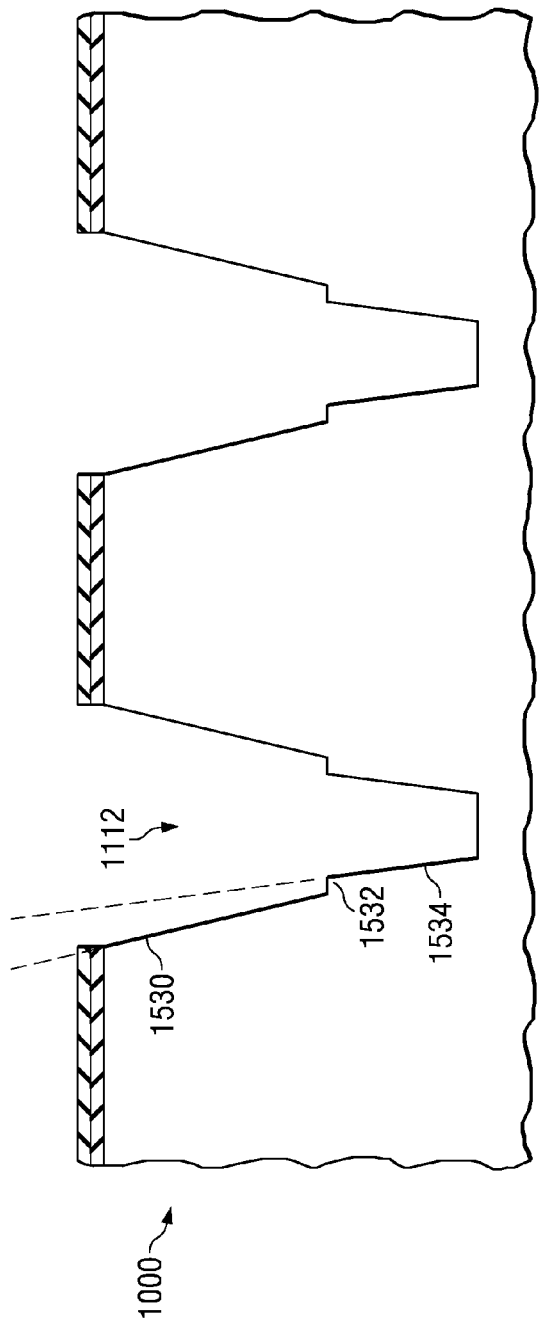

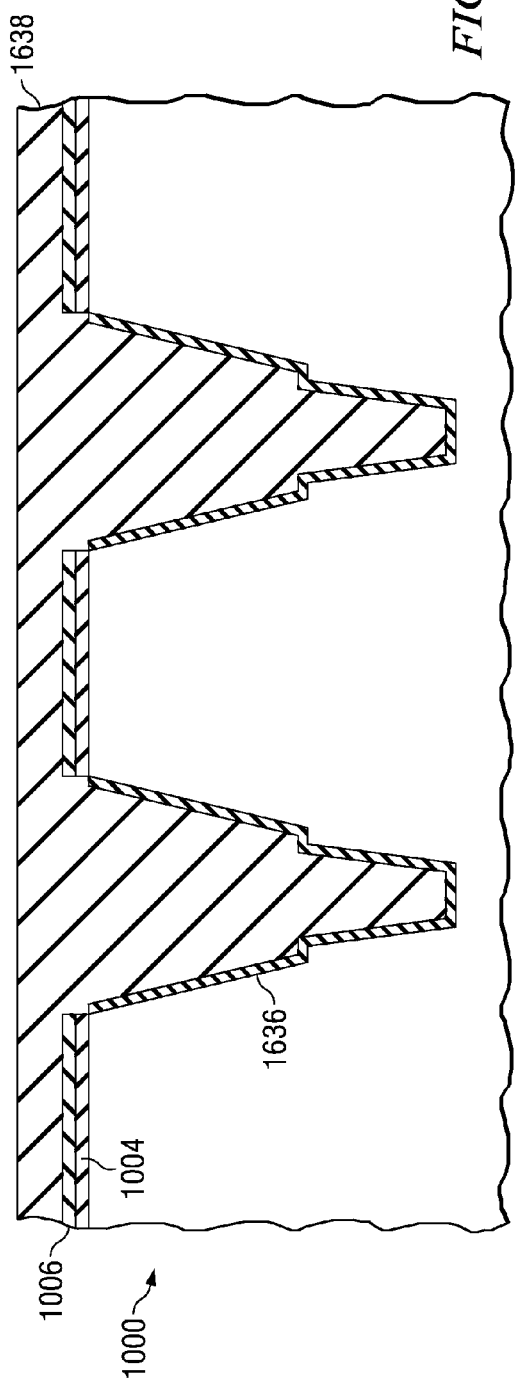
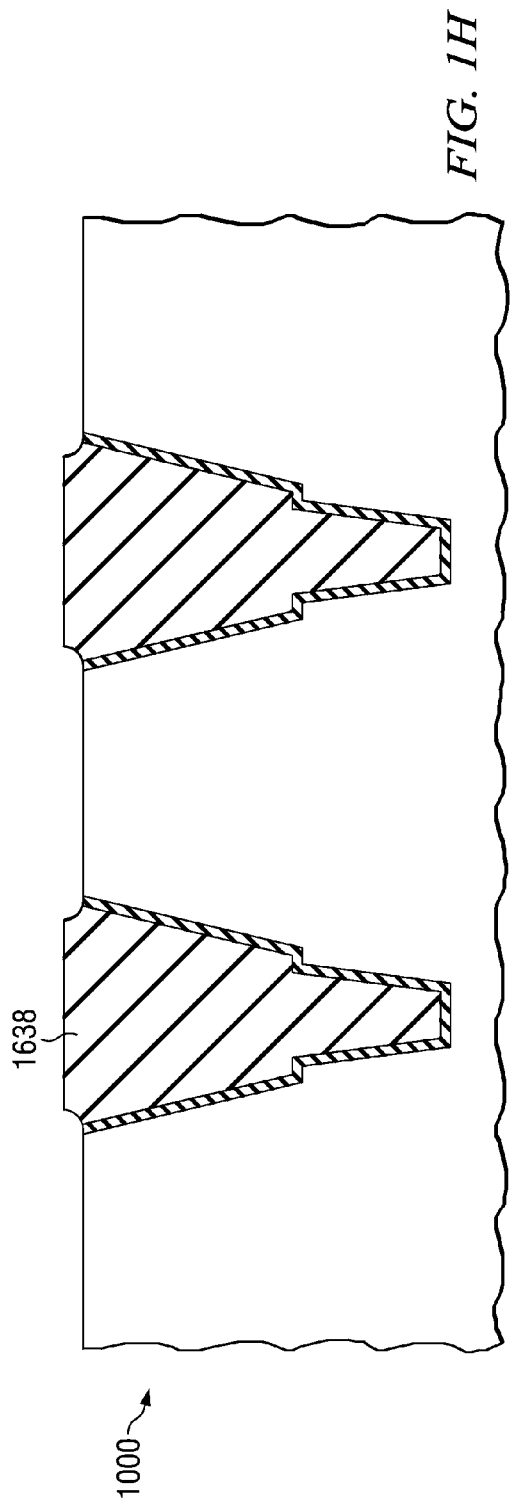

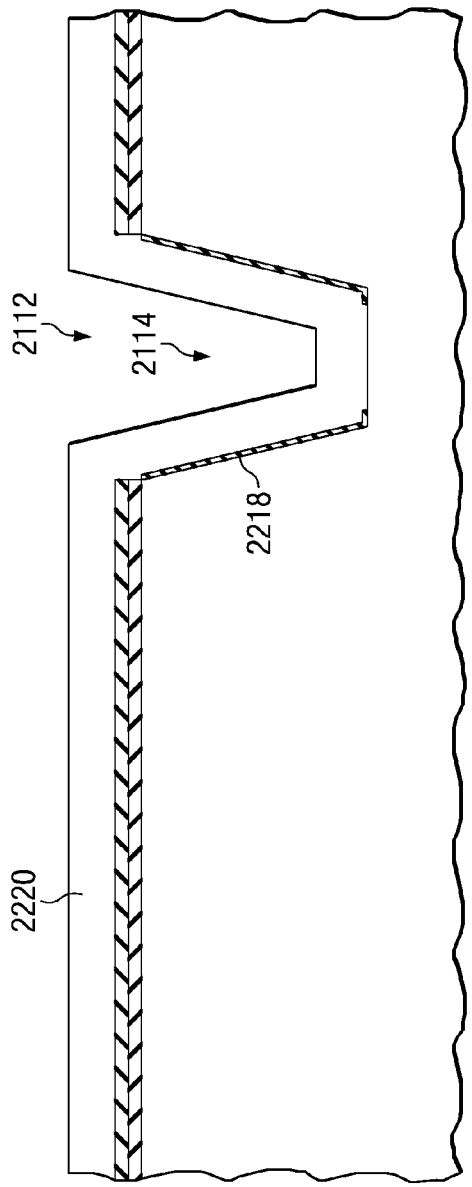
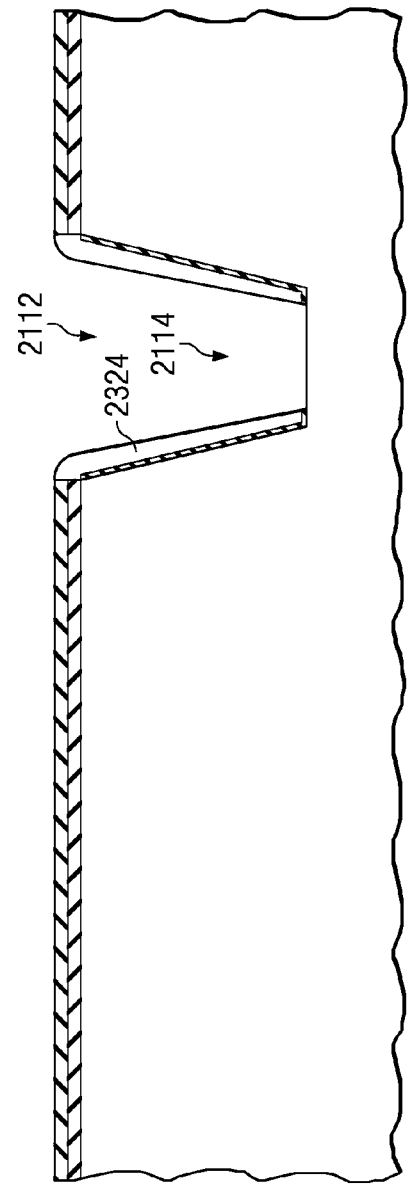

US 8,691,661 B2

TRENCH WITH REDUCED SILICON LOSS

CROSS-REFERENCE TO RELATED APPLICATIONS

This application claims the benefit of priority under U.S.C. §119(e) of U.S. Provisional Application No. 61/407,756, filed Oct. 28, 2010, the entirety of which is herein incorporated by reference.

The following co-pending patent application is related and hereby incorporated by reference: U.S. patent application Ser. No. 13/284,181 With its mention in this section, this patent application is not admitted to be prior art with respect to the present invention.

FIELD OF THE INVENTION

This invention relates to the field of semiconductor devices. More particularly, this invention relates to trench isolation in semiconductor devices.

BACKGROUND OF THE INVENTION

As the dimensions of integrated circuits continue to scale to smaller an smaller dimensions, the electrical isolation of one transistor from the next becomes increasingly difficult. The most commonly used method for electrical isolation is shallow trench isolation (STI) in which shallow trenches are formed between transistors and filled with a dielectric. In instances where the voltage is higher, the trenches must either be made wider or deeper to support the higher voltage. Increasing the active pitch (trench opening width plus active geometry width) by making the trenches wider is the more manufacturable solution, but it also causes the area of the integrated circuit to increase thus reducing the number of chips that may be formed on a wafer with a resultant increase in cost per chip. Making the trenches deeper while keeping the active pitch constant is difficult because trench etch tends to increase the width of the trench opening for deeper trenches. This results in a decrease in the width of the active width resulting in reduced transistor drive current.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

In one embodiment, an isolation trench in a substrate of a semiconductor device has a shallower portion and a deeper portion and a transition region between the deeper portion and the shallower portion. A slope of a sidewall of the transition region sidewall is less vertical than a slope of a sidewall of the shallower portion and is less vertical than a slope of a sidewall of the deeper portion. The isolation trench contains a dielectric fill material.

In another embodiment, the isolation trench is formed by forming a first portion of the isolation trench in a substrate of the semiconductor device; forming polysilicon sidewalls on walls of the first portion; etching the substrate below the first portion to form a second portion of the isolation trench; and filling the isolation trench with a dielectric fill material.

DESCRIPTION OF THE VIEWS OF THE DRAWING

FIG. 1A through 1H are illustrations of steps in the fabrication of a semiconductor device formed according to a first embodiment.

FIG. 2A through 2H are illustrations of steps in the fabrication of a semiconductor device formed according to a second embodiment.

DETAILED DESCRIPTION

Figure 2A:
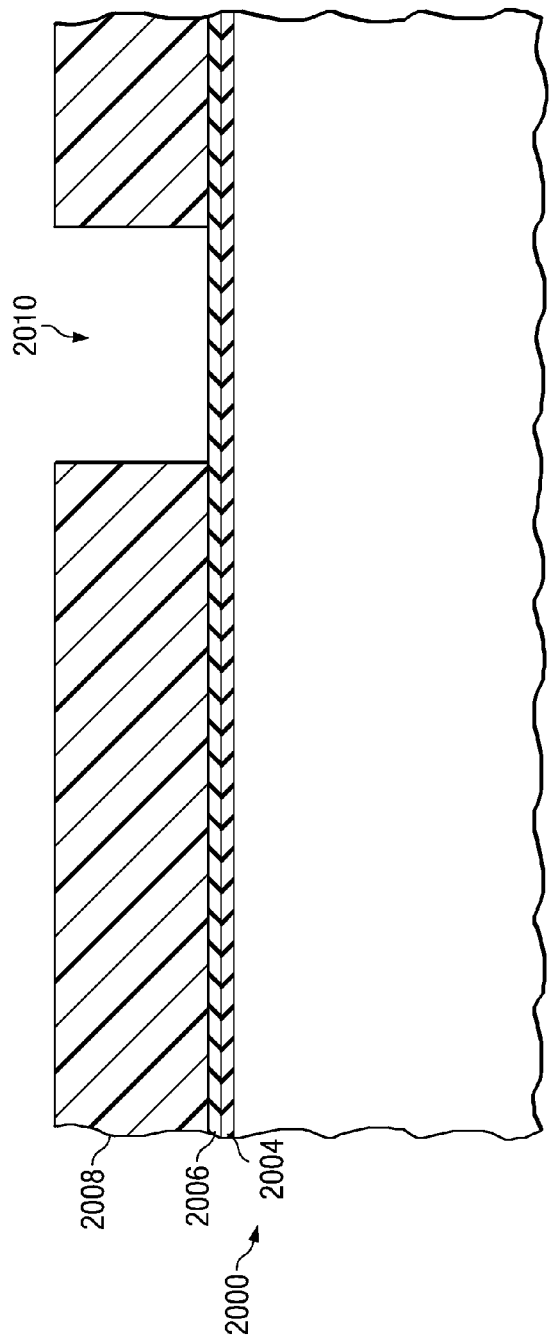

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A method of forming an isolation trench with increased depth without increasing active pitch according to an embodiment is described in FIGS. 1A through 1H.

FIG. 1A shows a semiconductor device 1000 having a semiconductor substrate 1002 upon which a pad oxide 1004 is grown and a silicon nitride film 1006 is deposited. An active photo resist pattern 1008 is formed on substrate 1002. Photo resist pattern 1008 has openings 1010 in which isolation trenches are to be formed.

FIG. 1B shows semiconductor device 1000 after the silicon nitride film 1006 and the pad oxide layer 1004 are etched and isolation trench 1112 is partially etched into substrate 1002. A first portion of isolation trench 1112 may be etched to a depth of 100 to 500 nm. Etching a minimum width trench deeper may result in erosion of the top of the trench opening causing the top of the trench 1114 to widen and the active width 1116 to become narrower. If the active width 1116 is a transistor channel this will decrease the transistor width with a resulting decrease in transistor drive current which is undesirable.

To prevent erosion of the top of the trench 1112 which would increase the size of the trench opening, a layer of polysilicon 1220 is deposited over the partially etched trench as shown in FIG. 1C and then etched to form sidewalls 1324 as shown in FIG. 1D. Prior to the polysilicon deposition, a thin pad dielectric 1218 may optionally be deposited or grown on the surface of trench 1112. The thin pad dielectric 1218 may be an oxide that is 3 to 9 nm thick and the layer of polysilicon 1220 may be 5 to 15 nm thick.

The trench 1112 is then etched to full depth which may be 200 to 1000 nm deep as shown in FIG. 1E. The polysilicon sidewalls 1324 protect the sidewalls of the upper portion 1426 of the trench 1112 from erosion while the lower portion 1428 of the trench 1112 is being etched. Since trench etch is a silicon etch, the polysilicon sidewalls may be partially consumed during the etch of the lower portion 1428 of the trench 1112. During the lower portion etch approximately 5 nm of the polysilicon sidewall may be etched. Optionally, the thickness of the polysilicon sidewall 1324 may be optimized so that it is completely consumed during etch of the lower portion of the trench.

The trench 1112 is shown in FIG. 1F after the polysilicon sidewall 1324 and pad oxide 1218 (if present) are removed. If the polysilicon sidewall thickness is completely consumed during the etch of the lower portion 1428 of the trench 1112 the step of removing the polysilicon sidewall is omitted. The lower portion 1428 of the trench 1112 which was etched with the polysilicon sidewalls in place may have a more vertical sidewall slope 1534 than the sidewall slope 1530 of the upper portion 1426 of the trench 1112. There also may be a short transition region 1532 between the upper portion 1426 of the trench 1112 which was etched prior to formation of the polysilicon sidewalls and the lower portion 1428 of the trench 1112 that was etched after formation of the polysilicon sidewalls. How pronounced the transition region 1532 appears may be determined by the width of the polysilicon sidewalls 1324. The slope of the sidewall of the transition region 1532 is less vertical the slope 1534 or the slope 1530.

After the polysilicon sidewalls 1324 are removed, the trench 1112 is filled with dielectric 1638 and the dielectric is planarized as shown in FIGS. 1G and 1H using commonly used procedures. The trench may be first lined with a dielectric 1636 such as oxide or oxide plus nitride or a nitrided oxide. The liner dielectric may be thermally grown or deposited using a CVD process for example. The trench may then be filled with a dielectric 1638 such as sub atmospheric chemical vapor deposition (SACVD) oxide, high density plasma (HDP) oxide or high aspect ratio (HARP) oxide as shown in FIG. 1G.

FIG. 1H shows the integrated circuit 1000 after planarization by chemical mechanical polishing (CMP) and removal of the silicon nitride film 1006 and the pad oxide layer 1004.

Additional processing then may be performed to build transistors and other electrical devices and also to build the interconnection layers to complete the integrated circuit.

In some applications it may be desirable to form deep trenches on portions of the chip where high voltage circuits are constructed and to form shallow trenches where low voltage circuits are constructed. One embodiment in which both deep and shallow isolation trenches are simultaneously formed is illustrated in FIGS. 2A through 2G.

In FIG. 2A, pad oxide 2004 is grown and silicon nitride film 2006 is deposited on silicon substrate 2002 of semiconductor device 2000. A first active photoresist pattern 2008 is then formed over silicon substrate 2002 with openings 2010 where the deep isolation trenches which may be used to isolate high voltage devices are to be formed.

Figure 2B:
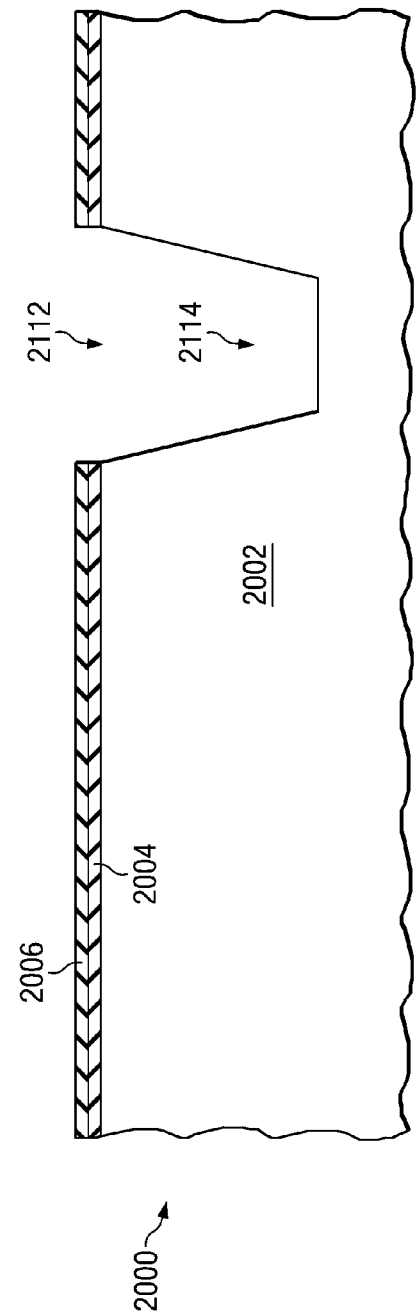

A first portion 2114 of deep isolation trench 2112 is etched and active photoresist pattern 2008 is removed as shown in FIG. 2B. The photo resist pattern 2008 may be removed prior to or post trench etch. It is preferred to remove the pattern 2008 after the silicon nitride layer 2006 and pad oxide layer 2004 have been etched and before the silicon substrate 2002 is etched to reduce etch microloading effects which may cause the trench depth and sidewall profile to vary across the chip and across the wafer. The first portion 2114 of the deep isolation trench 2112 may be etched to a depth of 100 to 500 nm.

In FIG. 2C, a conformal layer of polysilicon 2220 is deposited over the silicon substrate 2002 and in FIG. 2D the layer of polysilicon 2220 is anisotropically etched to form sidewalls 2324 on the first portion 2114 of deep isolation trench 2112. The layer of polysilicon 2220 may be deposited with a thickness in the range of 5 nm to 15 nm. In a preferred embodiment the thickness is 7 nm. A thin dielectric layer 2218, for example an oxide with a thickness in the range of 3 nm to 9 nm, may be formed in deep isolation trench 2112 under the polysilicon layer 2220 if desired.

Figure 2E:
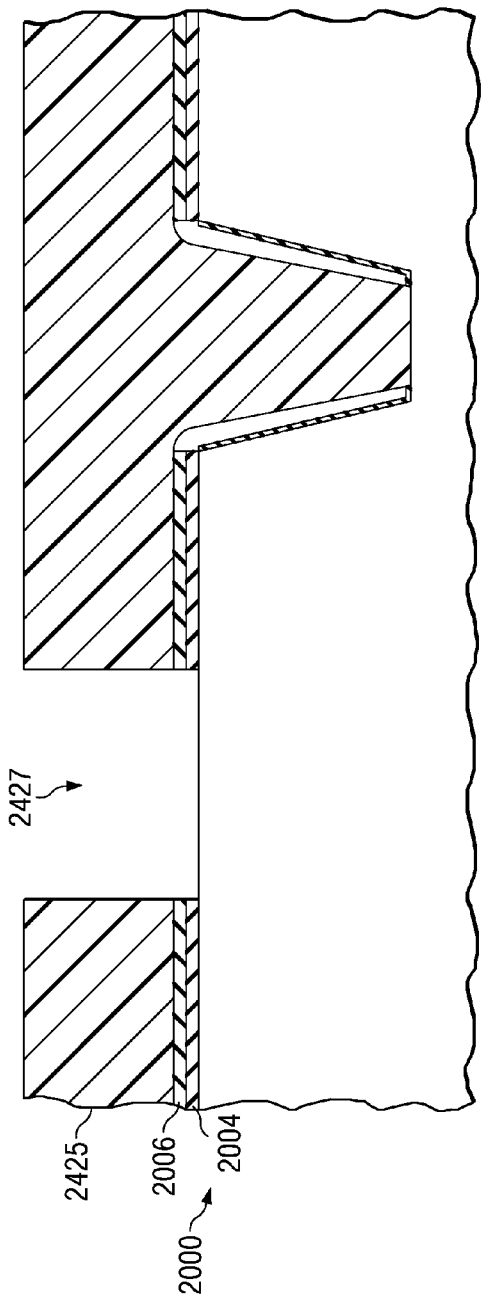

In FIG. 2E a second active photoresist pattern 2425 is formed over the substrate 2002 with openings 2427 over the areas where shallow isolation trenches are to be formed. Silicon nitride layer 2006 and pad oxide layer 2004, which form a hardmask, are etched in the patterned shallow trench openings 2427. The second active photoresist pattern 2428 is then removed prior to the second trench etch.

Figure 2F:
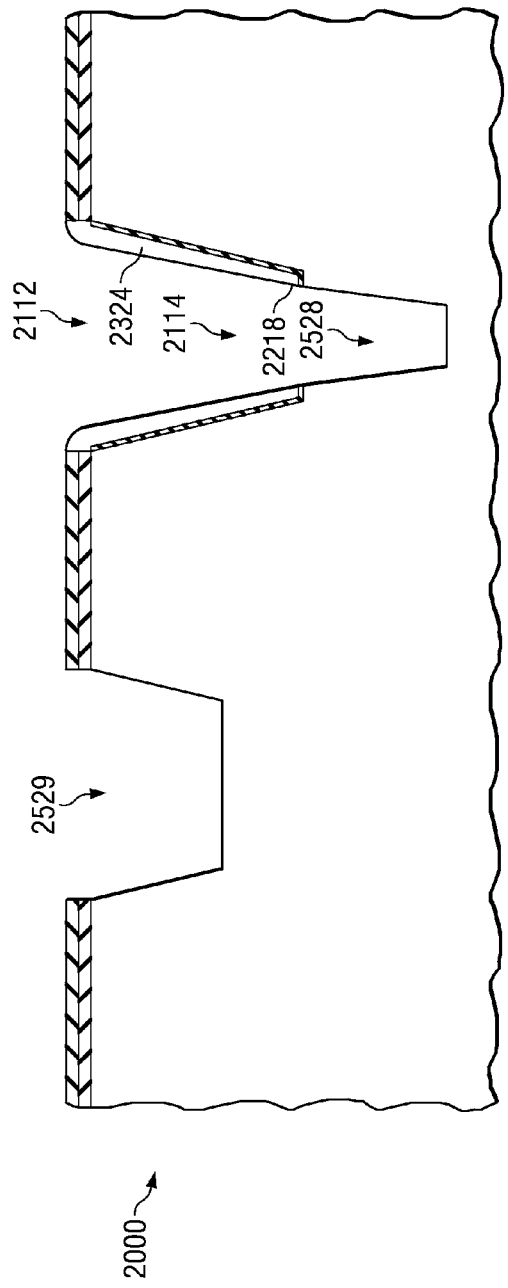

Shallow isolation trench 2529 and the second portion 2528 of deep high voltage trench 2112 are etched together as shown in FIG. 2F. The shallow trench 2529 may be etched to a depth of 100 to 500 nm and the depth of the deep trench 2112 may be increased to a depth of 200 nm to 1000 nm. After the second trench etch the polysilicon sidewall 2324 and liner dielectric 2218 (if present) may be removed.

Figure 2G:
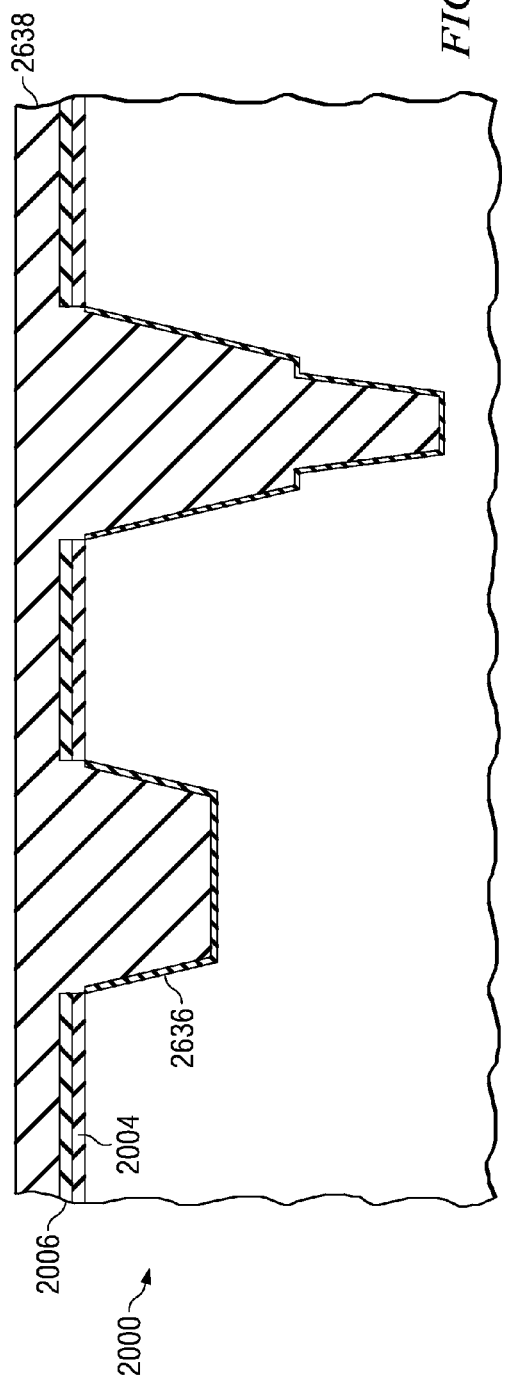

FIG. 2G shows a view of the semiconductor device 2000 after a dielectric liner 2636 has been thermally grown or deposited in trenches 2529 and 2112 and the trenches 2529 and 2112 then filled with a dielectric 2638.

Figure 2H:
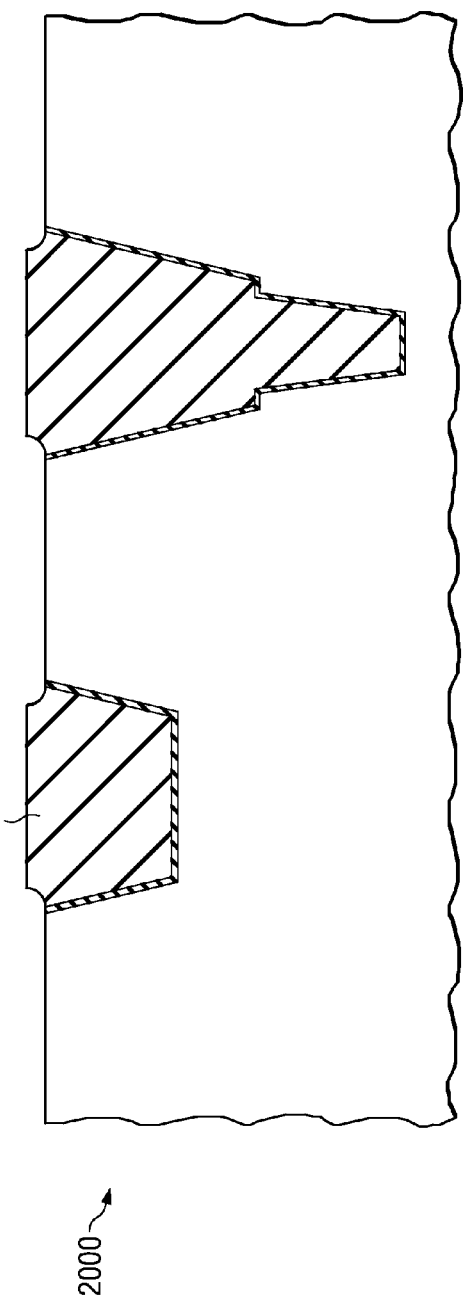

The dielectric 2638 is then planarized and the silicon nitride layer 2006 and pad oxide layer 2004 removed as shown in FIG. 2H.

Additional processing to form devices and interconnection may then be performed to complete the integrated circuit.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a semiconductor device, comprising the steps of:
   forming a first portion of an isolation trench in a substrate of said semiconductor device;
   forming polysilicon sidewalls on walls of said first portion;
   etching said substrate below said first portion to form a second portion of said isolation trench; and
   filling said isolation trench with a dielectric fill material;
   wherein said polysilicon sidewalls are completely consumed during said step of etching said substrate below said first portion to form said second portion of said isolation trench.

2. The method of claim 1 wherein said polysilicon sidewalls are removed prior to said step of filling said deep isolation trench with said dielectric fill material.

3. The method of claim 1 wherein a depth of said first portion is in the range of 100 to 500 nm.

4. The method of claim 1 wherein a depth of said deep isolation trench is in the range of 200 to 1000 nm.

5. The method of claim 1 wherein a thickness of said polysilicon sidewalls is in the range of 5 to 15 nm.

6. The method of claim 1 wherein a transition region is formed between said first portion and said second portion and a slope of a sidewall of said transition region is less vertical than a slope of a sidewall of said first portion and is less vertical than a slope of a sidewall of said second portion.

7. A method of forming a semiconductor device, comprising the steps of:

forming a first photoresist pattern on a substrate of said semiconductor device with a pattern for a deep isolation trench;

etching said substrate to form a first portion of said deep trench isolation trench;

forming polysilicon sidewalls on said first portion;

forming a second photoresist pattern on said substrate with a pattern for a shallow isolation trench;

etching said second active photoresist pattern into a hardmask on said substrate;

removing said second photoresist pattern;

etching said substrate to form said shallow isolation trench and additionally etching said substrate below said first portion to form a second portion of said deep isolation trench; and filling said shallow isolation trench and said deep isolation trench with a dielectric fill material.

8. The method of claim 7 wherein said polysilicon sidewalls are completely consumed during said additionally etching said first portion.

9. The method of claim 7 further comprising the step of removing said polysilicon sidewalls prior to said filling said deep isolation trench with said dielectric fill material.

10. The method of claim 7 wherein a depth of said shallow trench isolation trench and wherein a depth of said second portion of said deep isolation trench is in the range of 100 to 500 nm.

11. The method of claim 7 wherein a depth of said first portion is in the range of 100 nm to 500 nm.

12. The method of claim 7 wherein a depth of said deep isolation trench is in the range of 200 nm to 1000 nm.

13. The method of claim 7 wherein a thickness of said polysilicon sidewalls is in the range of 5 to 15 nm.

* * * * *